United States Patent [19]

Takata

[11] 4,125,806
[45] Nov. 14, 1978

[54] NON-DESTRUCTIVE SCREENING DEVICE FOR GLASS DIODE

[75] Inventor: Masanori Takata, Yokohama, Japan

[73] Assignee: Hitachi, Ltd., Japan

[21] Appl. No.: 773,173

[22] Filed: Mar. 1, 1977

[30] Foreign Application Priority Data

Mar. 3, 1976 [JP] Japan ............................... 51-22107

[51] Int. Cl.² ........................................... G01R 31/22
[52] U.S. Cl. ............................................. 324/158 D
[58] Field of Search ..................... 324/158 D, 158 T; 29/574

[56] References Cited

U.S. PATENT DOCUMENTS

| 3,371,276 | 2/1968 | Schiff | 324/158 T |
| 3,979,672 | 9/1976 | Arnoldi | 324/158 D |

Primary Examiner—Rudolph V. Rolinec
Assistant Examiner—Ernest F. Karlsen

Attorney, Agent, or Firm—Craig & Antonelli

[57] ABSTRACT

A non-destructive screening device for a glass diode includes a first circuit which determines a semiconductor element is acceptable when detecting a current oscillation caused by a micro plasma oscillation arising when the semiconductor current avalanche, and a second circuit which determines that the semiconductor element is unacceptable when detecting a void discharge due to a detrimental void, when a saw tooth signal pulse, which is to be built up to a level corresponding to the avalanche operation of the semiconductor and restricted to a current from a constant current source, is applied in a reverse direction to a circuit including the semiconductor element passivated with glass and a resistor connected in series thereto. According to the above discriminating operations, a material to be inspected may be screened in a non-destructive condition.

12 Claims, 8 Drawing Figures

NON-DESTRUCTIVE SCREENING DEVICE FOR GLASS DIODE

BACKGROUND OF THE INVENTION

This invention relates to a device for inspecting the electric characteristics of a semiconductor element which has been subjected to passivation with glass, and more particularly to a device for inspecting the semiconductor element in a non-destructive condition by detecting a detrimental void produced in a glass, which void is present along the boundary surface between a junction portion of a junction diode and glass.

SUMMARY OF THE INVENTION

It is an object of the present invention to provide a device for screening semiconductor elements in a non-destructive manner by detecting the detrimental voids in the semiconductor element passivated with glass.

A principle incorporated in the present invention is as follows. The deterioration of a semiconductor element in a screening process resorting to its destructive examination of applying a surge pulse can be attributed to a void which is present in the glass on a boundary surface between the semiconductor element and the glass. The semiconductor element is broken in a manner such that when a high voltage of about 1000 V is impressed in a reverse direction, a high voltage is applied to the void which overlaps extended portion of a depletion layer in a PN junction portion of the semiconductor element thereby causing the void discharge which leads to breakage of the boundary surface of the semiconductor element. According to the screening device of the invention, the void discharge phenomenon is detected and then the void-discharge energy is suppressed in a voltage impressing circuit so as not to break the semiconductor element, thereby discriminating with a discharge waveform in screening the semiconductor elements in a non-destructive manner. According to the present invention, there is provided a power source which is restricted for current so as not to break a semiconductor element, and a voltage of a triangular wave is applied from the above power source in a reverse direction to a PN junction of the semiconductor element passivated with glass for operating in an avalanche-operational region, so that the waveform of current flowing through the semiconductor element due to the voltage thus applied may be detected by a detecting means. In other words, when an oscillating current produced due to microplasma is detected, the semiconductor element is determined to be acceptable, and when a void discharge current which is produced due to a void present in the glass along the boundary surface of a PN junction, the semiconductor element is determined to be unacceptable, so that the semiconductor element passivated with glass may be determined to be acceptable or unacceptable in a non-destructive manner.

DESCRIPTION OF THE PREFERRED EMBODIMENTS

Figure 1:
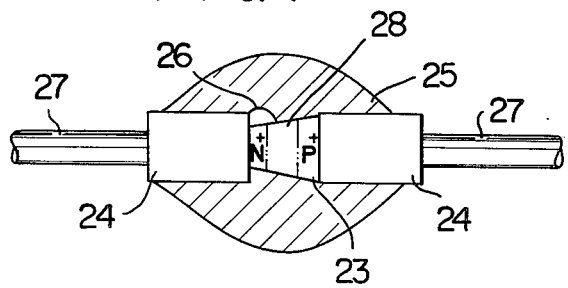
FIG. 1 is a view showing the general construction of an avalanche diode.

FIG. 1 is a view showing a general construction of an avalanche diode. A silicon pellet 23 is formed with electrodes 24 on its opposite sides. The electrodes 24 are made of molybdenum or tungsten and are provided with lead portions in the form of conductors 27 made of copper or the like. The outer surfaces of the electrodes 24 and silicon pellet 23 are molded with glass 25 for passivation. A void 26 is trapped on a boundary surface between the silicon pellet 23 and the glass 25 in a molding process. An depletion layer 28 is formed on the silicon pellet 23, which layer has a width larger than that of a general type diode for operating a PN junction diode in an avalanche region. It is known that the width of the depletion layer 28 is increased commensurate with voltage, when a high voltage in a reverse direction is applied thereto externally. In this respect, when the electric characteristics of a glass diode are measured for screening, a semiconductor is often broken due to the power impressed thereon and thus loses its desired function as a diode since its characteristics non depend on the relative position of the void 26 to the depletion layer 28 which are positioned on and around a boundary surface between the glass and the semiconductor element. This void also leads to breakage of the semiconductor element passivated with glass which may be used as a general type diode since its void exerts no influence on the reliability of the semiconductor element. The semiconductor element thus broken must be discarded. It follows from this that the cost of an avalanche diode is increased.

Figure 2:
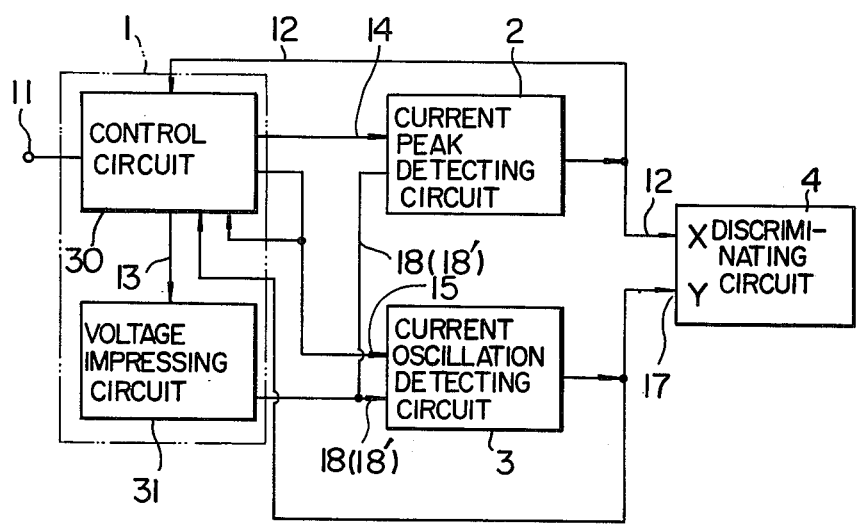
FIG. 2 is a block diagram illustrative of one embodiment of the invention.

The present invention will now be described in more detail with reference to the accompanying drawings. As shown in FIG. 2, a power source circuit 1 includes a control circuit portion 30 and a voltage impressing circuit 31. Shown at 2 is a current peak detecting circuit adapted to detect the peak of a current flowing through a test sample 16 comprising a semiconductor element passivated with glass set in the voltage impressing circuit 31. Shown at 3 is a current oscillation detecting circuit adapted to detect the oscillation of a current, which is caused by microplasma resulting from a test sample causing avalanche. Shown at 4 is a discriminating circuit, which discriminates between acceptable and nonacceptable elements as avalanche diodes, and is adapted to receive respective output signals detected in the detecting circuit 3 for the aforesaid inspection.

Figure 3:
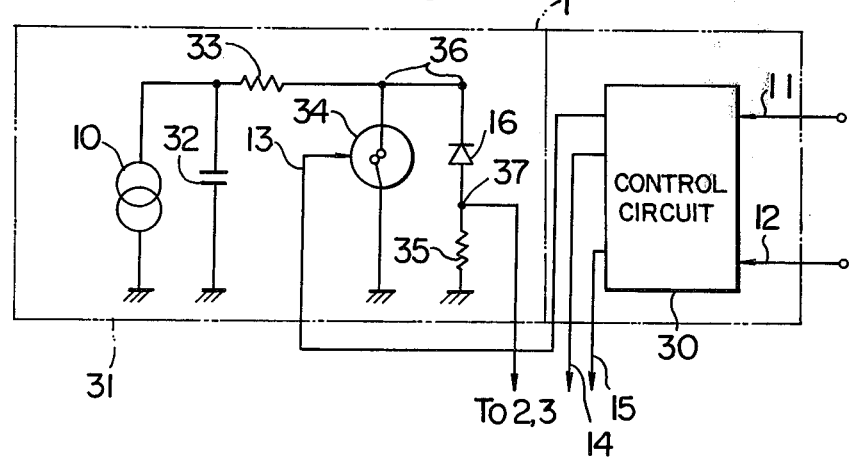
FIG. 3 is a detailed diagram of a power source circuit.

The control circuit 30 in FIG. 3 comprises means for generating a relay drive signal 13 according to a start triggering signal 11, means for generating a current peak detecting timing pulse 14 according to the aforesaid start triggering signal 11 with some delay as compared with the latter, means for generating a current oscillation detecting timing pulse signal 15 which is operated according to a current peak signal from the current peak detecting circuit, and means for resetting the relay drive pulse signal according to part of a waveform of a signal generated by the means for generating the signal 15.

The arrangement of the voltage impressing circuit 31 is as follows.

Figure 4:
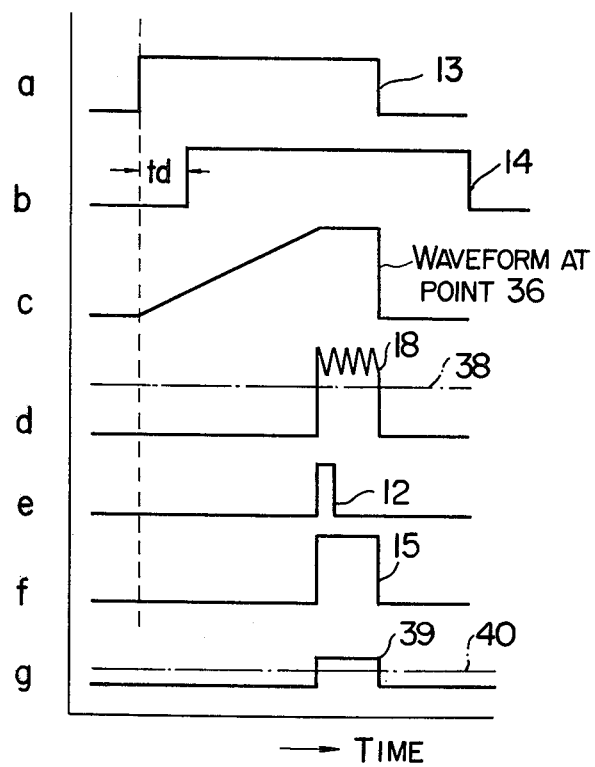
FIG. 4 and FIG. 5(a) to (g) are plots showing operating waveforms of respective parts of the device.
Figure 5:
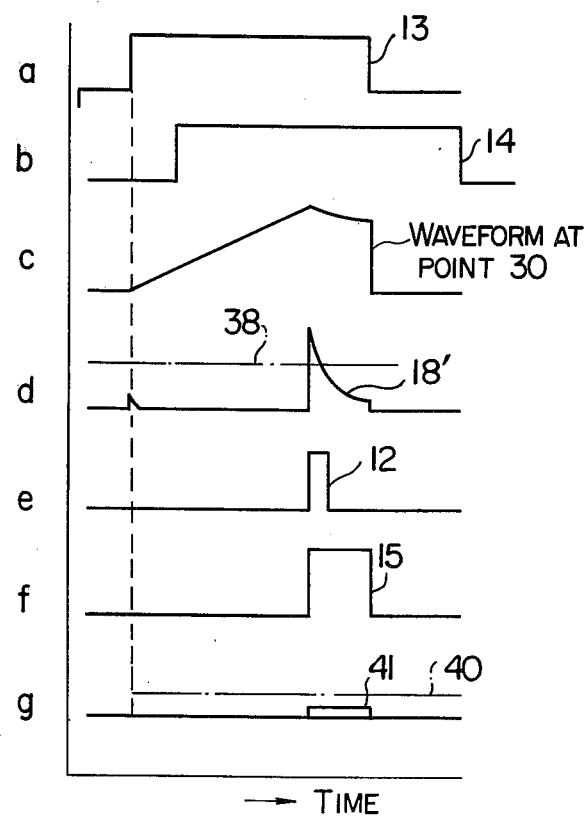
Figure 6:
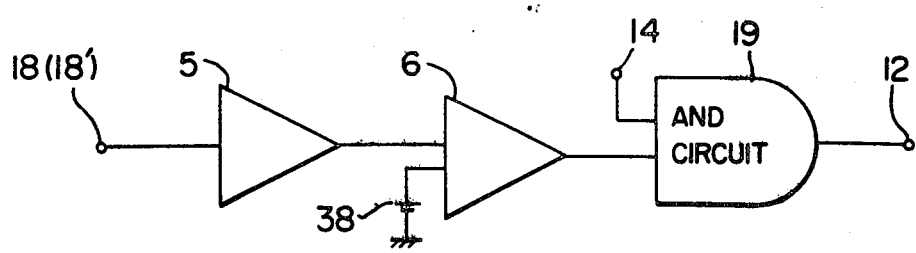
FIG. 6 is a detailed diagram of a current peak detecting circuit of FIG. 2.
Figure 7:
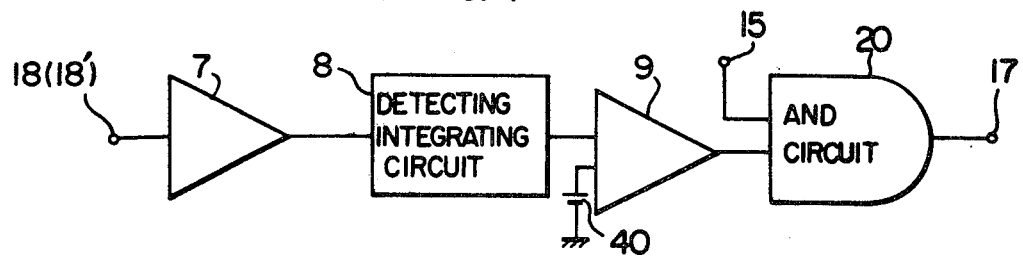
FIG. 7 is a detailed diagram of a current oscillation detecting circuit of FIG. 2.

As shown in FIG. 3, a constant current power source 10 is provided in parallel with a capacitor 32, while a junction between the power source 10 and the capacitor 32 is connected on its one side to a resistor 33 and on the other side to a junction between the cathode of a test sample 16 and a contact of a relay 34. The latter junction is shown at 36. Shown at 37 is a junction of an anode of the test sample 16 connected to one end of a resistor 35. The other ends of the constant current power source 10, of the capacitor 32, and of the resistor 35 and the other contact of the relay 34 are all connected to a common return line, thereby completing a closed circuit. The contacts of the relay 34 in this circuit are maintained closed all the times. Thus, when a relay drive signal is supplied to a coil (not shown) of the relay 34, then the contacts of the relay 34 are opened, thereby opening the circuit which has been short-circuiting a series circuit of the test sample 16 and resistor 35. Then, electric charges from the constant current power source 10 are accumulated in the capacitor 32, so that a high voltage is produced at the opposite ends of the capacitor 32. The high voltage generated at the opposite ends of the capacitor 32 are impressed by way of the resistor 33 on the test sample 16, thereby raising a potential at the junction 36 as shown in FIG. 4(c). When a voltage being impressed on the test sample 16 exceeds an avalanche voltage of the sample or a generating voltage for void discharge, then a current flows through the test sample 16, thereby raising a potential at the junction 37 in FIG. 3. The potential at the junction 37 is fed to the current peak detecting circuit 2 and the current oscillation detecting circuit 3 in FIG. 2 as a current signal 18 for a normal avalanche diode, and as a current signal 18' for a void discharge. In a normal avalanche phenomenon, a current waveform due to a so-called micro-plasma is produced, in which ten or more oscillations occur in a relatively short period of time (approximately 10ms), as shown by a waveform 18 in FIG. 4(d). On the other hand, in the case of a void-discharge, a waveform which oscillates only once is produced, as shown in FIG. 5(d). FIG. 6 is a detailed diagram showing the current peak detecting circuit 2 of FIG. 2. As shown, current signals 18, 18' are amplified by a high-input-impedance d.c. amplifier 5 and then fed to a terminal of a comparator 6. Impressed on the other terminal of the comparator 6 is a d.c. voltage 38 which is slightly lower than a current peak caused by microplasma and a current peak caused by the void discharge. The comparator 6 compares the voltage 38 with signals which have been obtained by amplifying the aforesaid current signals 18, 18' discriminating for their levels, so that when there is noted a current peak caused either by the microplasma or by void discharge, then the comparator 6 feeds "1" to one end of an AND circuit 19. The other end of the AND circuit 19 receives a current peak detecting timing pulse 14, as shown in FIG. 4(b), from the control circuit 30. This current peak detecting timing pulse 14 is so designed as to start with a delay (td), as compared with the starting of the relay drive pulse signal, for preventing the circuit 2 from being operated by the charge current to the semiconductor element at the initial phase of impression of a voltage on the test sample 16. The AND circuit 19 gates two inputs so as to feed a current peak signal as shown in FIG. 4(e) to provide a "1" to the control circuit 30 as well as to a terminal (X) of the discriminating circuit 4. The discriminating circuit 4 is provided with a memory circuit (not shown) which stores a signal "1" fed to the terminal (X) until an input signal is fed to the other terminal (Y). The control circuit 30 receives a current peak signal 12, thereby feeding a current oscillation detecting timing pulse signal 15 to the current oscillation detecting circuit 3 in the rising position of the signal. The detection of a current peak alone can not lead to a decision whether the test sample 16 causes an avalanche or void discharge. For this reason, there is provided a current oscillation detecting circuit 3 adapted to detect an oscillatory phenomenon of a current produced due to microplasma 18 as shown in FIG. 4(d), which is likely to take place upon entrance of the test sample into avalanche. This circuit 3 detects both the oscillatory phenomena due to the microplasma 18 and the void discharge current 18'. First, description will be given of the case of the microplasma 18. As shown in FIG. 7, a signal associated with the microplasma 18 is amplified by an a.c. amplifier 7 of a high input impedance, and then detected and integrated in a detecting integrating circuit 8, thereby converting the microplasma 18 into a d.c. level 39 as shown in FIG. 4(g). The integration circuit used here may be a conventional integration circuit. An output thus converted is fed to one end of the comparator 9. Impressed on the other end of the comparator 9 beforehand is a d.c. reference voltage 40 which is lower in level than the detected and integrated value of an a.c. current corresponding to a plasma discharge but higher than a detected and integrated value corresponding to an a.c. component of the void discharge. The comparator 9 compares the above value 40 with the aforesaid d.c. level 39, thereby providing an output which is then fed to the AND circuit 20. In case the values 39 which has been derived by converting the aforesaid microplasma 18 into a d.c. level is higher than the reference level 40, then an output "1" is fed to one end of the AND circuit 20. Furthermore, the current oscillation detecting timing pulse signal 15 is fed as an output "1" to the other end of the circuit 20. From these inputs thus AND-gated, there may be generated a current oscillation signal 17, which in turn is fed to the other terminal (Y) of the discriminating circuit 4, as an output "1".

Figure 8:
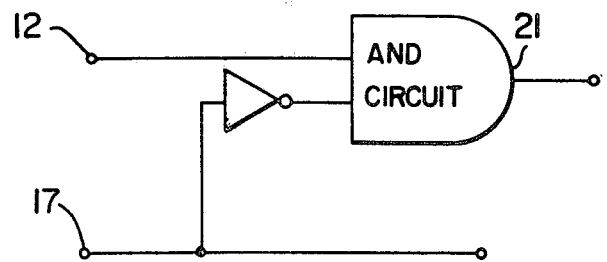
FIG. 8 is a detailed diagram of a discriminating circuit of FIG. 2, which discriminates between acceptable and unacceptable semiconductor elements.

With the discriminating circuit 4 of FIG. 8, the current peak signal 12 and current oscillation signal 17 are discriminated in the AND circuit 21. Thus, when the current oscillation signal 17 is fed, then the semiconductor element is decided as acceptable. Meanwhile, the aforesaid reference level is set to a value which is lower than a detected and integrated value of microplasma current but higher than a detected and integrated value of a void discharge current.

Description will be given of the case of the void discharge with reference to the waveform shown at 18' in FIG. 5(d).

In the case of the occurrence of a void discharge, the circuit operates in a manner described thus far. However, as shown in FIG. 5(d), the waveform is less in an a.c. component, when observing a current signal in terms of a frequency component, so that an output 17 of the current oscillation detecting circuit 3 of FIG. 2 becomes "0", and hence the semiconductor element is decided as unacceptable by the discriminating circuit of FIG. 2.

Description will now be turned to a time restricting method for an impressing voltage, which is an essential factor for a non-broken screening featuring the present invention. Firstly, when the current oscillation detecting circuit 3 is operated according to a signal associated with the microplasma 18 and then the current oscillation signal 17 becomes "1", the relay drive pulse 13 is reset in a rising portion of the current oscillation signal 17.

The current oscillation signal 17 is not fed according to a signal 18', so that after the current oscillation detecting timing pulse 15 has been fed from the control circuit 30, the relay drive pulse 13 is reset in a rising portion of the pulse 15.

A resistor 33 having high resistance ($\approx 100$ M$\Omega$) restricts the inflow of charges accumulated in the capacitor 32, when a void discharge takes place, thereby serving to suppress the energy of void discharge.

According to the present glass molding technique, it is difficult to eliminate a void along the boundary surface of a pellet, and only 95% of completed products are found to be acceptable as avalanche diodes according to the prior art screening. 99.4% of the products which have been tested by the non-destructive screening device according to the present invention are found to be acceptable as avalanche diodes.

While the description has been had to a relay contact as a switching mechanism in the embodiments described, the present invention is by no means limited to this instance, but any means may be adopted in the present invention, as far as it provides a high voltage rating characteristic, high insulating property and short response time.

As is apparent from the foregoing description of the non-destructive screening method for a glass diode, according to the present invention, about 90% of general type diodes which would have been otherwise broken in manufacturing avalanche diodes may be safely manufactured according to the automatic discrimination of the invention, with ease, thereby reducing the manufacturing cost of avalanche diodes.

What is claimed is:

1. A non-destructive screening device for glass diode test sample comprising:
   a power supply circuit for applying to said test sample a reverse voltage having a level high enough for effecting an avalanche of said test sample;
   a peak current detecting circuit for detecting a peak current value in a current flowing through said test sample during plasma discharges and void discharges and generating an output when said peak current value exceeds a predetermined first level;
   a current oscillation detecting circuit for detecting an A.C. component in said current flowing through said test sample due to plasma discharges only, for amplifying said A.C. component, and for detection and integration the amplified A.C. component to convert it to a D.C. level and generating an output when said D.C. level exceeds a second predetermined level; and
   a decision circuit responsive to said output of said peak current detecting circuit and said output of said current oscillation detecting circuit to determine whether said test sample is acceptable or unacceptable.

2. A non-destructive screening device as set forth in claim 1 wherein said current oscillation detecting circuit descriminates whether said D.C. level exceeds said second predetermined level which is smaller than a detected and integrated value of current oscillation corresponding to plasma discharge of said test sample but greater than a detected and integrated value of current oscillation corresponding to the void discharge, and applies said output generated when said D.C. level exceeds said second predetermined level to said power source circuit, thereby starting a resetting means for interrupting a current flowing through said test sample.

3. A non-destructive screening device as set forth in claim 1 wherein said peak current detecting circuit includes means for detecting amplitude of current peaks flowing through said test sample by comparing same with said first predetermined level which is smaller than a current peak value corresponding to the plasma discharges of said test sample and a current peak value corresponding to the void discharges, thereby discriminating whether or not said current peak exceeds said first predetermined level.

4. A non-destructive screening device as set forth in claim 3, wherein said power supply circuit comprises:
   voltage impressing circuit means including a constant current source for providing a voltage to reverse bias said test sample, said voltage being increased with time to a level high enough for effecting an avalanche operation of said test sample, connecting circuit means for connecting said constant current source and said test sample in series, and switching means including a normally closed contact connected in parallel with said current source; and
   control circuit means having means for generating a drive signal to drive said switching means on the occurrence of a start signal; whereby
   said switching means maintained in a normally closed condition is brought to its open position according to a drive signal from said control circuit means, thereby impressing a voltage in a reverse direction on said test sample from said power supply circuit by way of said connecting circuit means, said voltage being increased with time to a level high enough for effecting avalanche operation of said test sample.

5. A non-destructive screening device as set forth in claim 4, wherein said control circuit means is provided with means for feeding to said current peak detecting circuit means a current peak detecting timing pulse which is delayed as compared with said drive signal to said switching means and generated on the occurrence of a start signal.

6. A non-destructive screening device as set forth in claim 5, wherein said current peak detecting circuit means is provided with a d.c. amplifier for amplifying said current peak signal; a comparator for comparing an output signal of said amplifier with said first level; AND gate circuit means for receiving an output signal of said comparator and said current peak detecting timing pulse signal as inputs; and means for feeding output signal from said AND gate circuit means to said decision circuit, as well as to said control circuit means.

7. A non-destructive screening device as set forth in claim 6, wherein said control circuit means is provided with means for receiving an output signal from said current peak detecting circuit and for feeding a current oscillation detecting timing pulse signal to said current oscillation detecting circuit in a rising portion of said input pulse signal.

8. A non-destructive screening device as set forth in claim 7, wherein said current oscillation detecting circuit comprises:
   an a.c. amplifier for amplifying said current oscillation signal;

a detecting and integrating circuit for receiving an output signal from said a.c. amplifier for detecting and integrating said output signal;

a comparator circuit for comparing the d.c. level of the output signal of said detecting and integrating circuit with said second level which is smaller than a detected and integrated value of an a.c. current corresponding to a plasma discharge of said test sample but larger than a detected and integrated value corresponding to an a.c. component of void discharge;

and AND circuit for receiving an output signal of said comparator circuit and said current oscillation detecting timing pulse signal as inputs; and means for feeding signals to said discriminating circuit, as well as to said control circuit.

9. A non-destructive screening device as set forth in claim 8, wherein said decision circuit decides that a semiconductor test sample is acceptable, when a "1" output signal of said current peak detecting circuit and a "1" output said current oscillation detecting circuit are received thereby.

10. A non-destructive screening device as set forth in claim 9, wherein said control circuit means feeds a current oscillation detecting timing pulse signal, then resets a signal to drive said switching means in a falling portion of said timing pulse signal, and interrupts a current to said test sample, with said switching means for said voltage impressing circuit means being maintained in its open condition.

11. A non-destructive screening device as set forth in claim 10, wherein said control circuit means resets a signal to drive said switching means in a rising portion of a pulse input signal, when an output of said current oscillation detecting circuit means is fed therein as "1"; and interrupts a current to said test sample, with said switching means for said voltage impressing circuit means being maintained in its open condition.

12. A non-destructive screening device as set forth in claim 4, wherein said switching means comprises a return relay having a normally closed relay contact which is opened by said drive signal.

* * * * *